US011460525B2

United States Patent
Taracila et al.

(10) Patent No.: US 11,460,525 B2
(45) Date of Patent: Oct. 4, 2022

(54) SYSTEMS AND METHODS FOR TOROIDAL TWINAX CABLE TRAP

(71) Applicant: GE Precision Healthcare LLC, Milwaukee, WI (US)

(72) Inventors: Victor Taracila, Orange Village, OH (US); Fraser John Laing Robb, Aurora, OH (US); Aleksey Zemskov, Solon, OH (US); David Louis Seamon Anderson, Berea, OH (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 296 days.

(21) Appl. No.: 16/789,293

(22) Filed: Feb. 12, 2020

(65) Prior Publication Data
US 2021/0247475 A1    Aug. 12, 2021

(51) Int. Cl.
*G01R 33/36*   (2006.01)

(52) U.S. Cl.
CPC .................................. *G01R 33/3685* (2013.01)

(58) Field of Classification Search
CPC ......... G01R 33/3685; H04B 3/28; H04B 3/30
See application file for complete search history.

(56) References Cited

U.S. PATENT DOCUMENTS

| 4,885,555 | A  | * | 12/1989 | Palmer | H04B 3/28 |
| | | | | | 174/32 |
| 4,922,204 | A  | * | 5/1990 | Duerr | G01R 33/3685 |
| | | | | | 324/318 |
| 6,593,744 | B2 | | 7/2003 | Burl et al. | |
| 6,974,905 | B2 | * | 12/2005 | Kazama | H01F 30/16 |
| | | | | | 333/12 |
| 2012/0074944 | A1 | * | 3/2012 | Leussler | G01R 33/36 |
| | | | | | 324/322 |
| 2015/0200645 | A1 | * | 7/2015 | Waks | H03H 7/42 |
| | | | | | 29/854 |
| 2021/0103018 | A1 | * | 4/2021 | Biber | G01R 33/36 |
| 2021/0181278 | A1 | * | 6/2021 | Schmid | G01R 33/34092 |

* cited by examiner

*Primary Examiner* — Steven L Yeninas
(74) *Attorney, Agent, or Firm* — Armstrong Teasdale LLP

(57) ABSTRACT

Various methods and systems are provided for a flexible, lightweight, and low-cost radio frequency (RF) trap for use in a magnetic resonance imaging (MRI) system. In one example, a radio frequency (RF) trap assembly for use in a magnetic resonance imaging (MRI) system is provided, comprising a twinax wire assembly having a plurality of looped portions, each ones of the plurality of looped portions tangentially in contact with a shielded cable, and at least one support structure for substantially maintaining the shape of the plurality of looped portions, the support structure surrounding a portion of the shielded cable, wherein the twinax wire assembly is tuned to a frequency suitable for increasing the impedance of the shielded cable.

20 Claims, 9 Drawing Sheets

SYSTEMS AND METHODS FOR TOROIDAL TWINAX CABLE TRAP

CROSS REFERENCE TO RELATED APPLICATIONS

N/A

FIELD

Embodiments of the subject matter disclosed herein relate to magnetic resonance imaging (MRI), and more particularly, to MRI radio frequency (RF) cable traps.

BACKGROUND

In magnetic resonance imaging (MRI), a subject is placed in a magnet. A subject is a human (live or deceased), an animal (live or deceased), or part of a human or an animal. When the subject is in the magnetic field generated by the magnet, magnetic moments of nuclei, such as protons, attempt to align with the magnetic field but process about the magnetic field in a random order at the nuclei's Larmor frequency. The magnetic field of the magnet is referred to as B0 and as in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

RF coils are used in MRI systems to transmit RF excitation signals and to receive the MR signals emitted by an imaging subject. Coil-interfacing cables, such as coaxial cables, may be used to transmit signals between the RF coils and other aspects of the processing system. Coaxial cable is designed to protect the system from picking up extraneous RF signals which are present in the environment. Coaxial cables feature a surrounding shield or ground conductor separated from a current carrying central conductor by a dielectric material. The surrounding ground conductor acts as a shield that minimizes the pick-up of foreign frequencies by the central conductor of the cable.

Although coaxial cable is used, there are still various issues with its use. For example, the shield conductor of the coaxial cable itself tends to carry foreign induced currents, such as from TV transmissions, stray harmonics from the gradient pulse oscillators and clocking circuits in nearby equipment, and the like. The induced current is often referred to as "skin current" because it flows on the outside of the shield conductor. The stray RF current tends to flow out of the bore and into other circuits, such as the amplifiers, analog-to-digital converters, receivers, and reconstruction processor to contribute errors in the resultant image.

Balance/unbalance ("Balun") circuitry is used as one means for reducing, or "trapping", the noise and/or stray RF currents generated due to induced currents in the coaxial cable. Baluns of the prior art consisted of an LC frequency filter for each cable located in a copper shielded box. The balun was tuned to the frequency of interest, such as by a tuning capacitor. In the art, the terms "Balun" and "RF Trap" are often used interchangeably. A cable RF trap has fundamentally the same function but can be placed anywhere on the cable. Its role consists in reduction of the cable radiation.

A Balun may be utilized for connection of a balanced transmission line (like a twisted pair—comprised of two conductors having two surfaces) to an unbalanced one (coaxial cable—also comprised of two conductors, but with three surfaces, each surface capable of sustaining independent high frequency current). A Balun forces the signal from a balanced transmission line to travel on two (out of three) surfaces of the unbalanced transmission line. This is realized by generating a high impedance on the third surface at the end of the transmission line where the interface between two transmission lines is realized.

However, the Baluns of the prior art are problematic for a number of reasons. For example, Baluns were inserted in-line with each coaxial cable interconnected with a Balun. As the number of RF channels increases, the number of coaxial connections becomes labor-intensive. The prior art Baluns are also space-consuming. In MRI systems, there are severe space limitations, creating the need to reduce the size and volume associated with Baluns. Similarly, prior art Baluns are expensive due to the use of special non-magnetic tuning capacitors and can be difficult to and time consuming to manufacture. Such cable traps are problematic for many reasons, including: they are bulky; they are difficult to tune, and are difficult to check the tuning; and it's often difficult to find the optimal location for the trap.

BRIEF DESCRIPTION

In one embodiment, an RF (Radio Frequency) trap for blocking stray signals on a shielded RF cable having a peripheral shield conductor and at least one inner conductor for carrying RF signals includes a conductive system inductively coupled to the shield conductor of the shielded RF cable comprising two parallel wires wherein at least one of the wires is noncontiguous, and a capacitive coupling between the conductive system and the shield conductor, the capacitive coupling being sized and the conductive system being shaped such that the capacitive and inductive couplings define an LC circuit with a resonance frequency at a frequency of RF signals carried on the inner conductor. The RF Trap includes a support structure for substantially maintaining the shape of the conductive system, the shape of the conductive system comprising a plurality of loops wrapped around the support structure, and may be sized to surround the shielded RF cable.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below.

DETAILED DESCRIPTION

Figure 1:
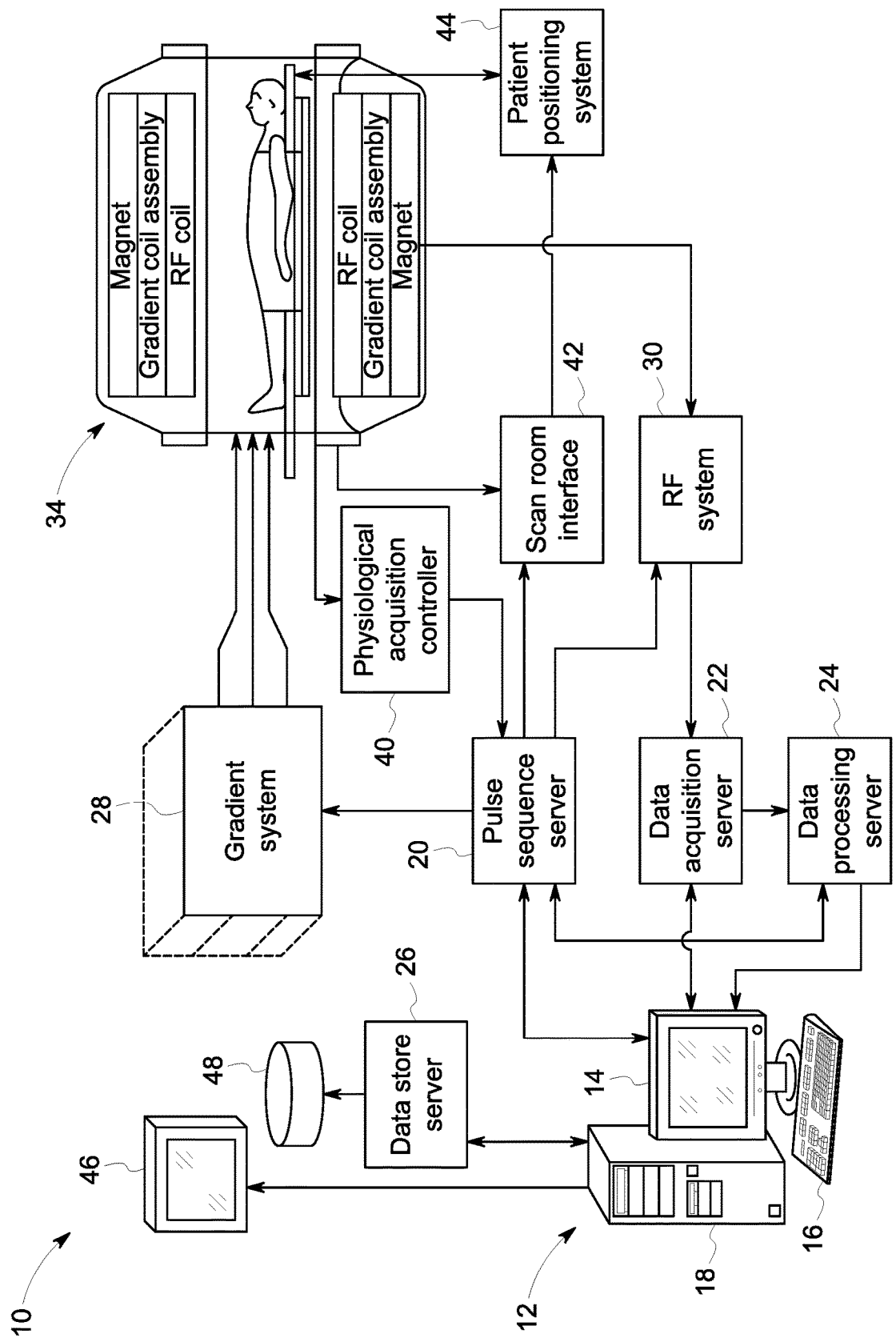
FIG. 1 is a schematic diagram of an exemplary magnetic resonance imaging (MRI) system.

The following description relates to various embodiments of a radio frequency (RF) trap in MRI systems. In particular, systems and methods are provided for a low-cost, flexible, and lightweight RF traps that effectively attenuate stray RF current and noise in an RF transmission cable. The RF trap may be used with any cables associated with an MRI system and may be used with coaxial cables. Typically, coaxial cables used in MRI systems are composed of a braided, tubular conductor which may be separated from a current-carrying central conductor by a dielectric material. The tubular outer conductor may be grounded to act as a shield that minimizes the pick-up of foreign frequencies by the central conductor. However, there may still be coupling problems at the high frequencies associated with magnetic resonance imaging and spectroscopy when using coaxial cables. Specifically, the braiding, or shielding, of the coaxial cable itself may carry foreign induced currents or "skin currents." Such stray RF current tend to flow along the cable out of the bore and into other circuits in the magnetic resonance apparatus.

The RF trap of the present disclosure includes a conductive system, which may be inductively coupled to the shield conductor of a shielded RF cable. The conductive system may comprise two parallel wires, with one or both of the wires cut or otherwise noncontiguous. The conductive system may be coupled to the shield conductor of a shielded RF cable in a capacitive manner such that the capacitive and inductive couplings may define an LC circuit that may have a resonance frequency at, or approximate to, the frequency of RF signals carried on the inner conductor a shielded RF cable.

Each RF trap may comprise a support structure which may substantially maintain the looped shape of the conductive system. The support structure may be torus-shaped with each loop of the conductive system passing through the center of the torus and fully around the outside perimeter of the support structure. The center of the torus, inclusive of the conductive system positioned therein, may be sized to slidably fit on a shielded RF cable so that the conductive system may be coupled to the shield conductor of the shielded RF cable in a capacitive manner.

The support structure of the RF trap may comprise an insulating material and may comprise, for example, polytetrafluoroethylene (PTFE). The support structure may be a solid or may be an inflated structure, for example. In either case, the support structure may generally take the form of a "donut", allowing for the maintaining the loop or circle-like structure of the conductive system around the perimeter of the shielded RF cable. Similarly, the support structure may be incorporated into the conductive system such that sufficient rigidity is provided to maintain a loop or circle-like structure without having a distinct support structure.

The RF trap may be about 2 cm to about 5 cm in diameter and may preferably be less than about 3 cm in diameter. Similarly, the support structure may be about 1cm to about 4 cm at its thickest part, and may be preferably less than about 2 cm thick. The number of loop or circle-like structures in each RF trap may vary depending on the impedance and tuning requirements and the size of the conductive system. Each RF trap may comprise more than two but less than twenty loops, and may preferably comprise fourteen loops.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In some embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M=\sqrt{I^2+Q^2} \quad (1);$$

and the phase of the received MR signal may also be determined as in Eq. (2) below:

$$\varphi = \tan^{-1}\left(\frac{Q}{I}\right). \quad (2)$$

In some embodiments, the pulse sequence server 20 also optionally receives subject data from a physiological acquisition controller 40. The controller 40 receives physiological signals from sensors connected to the subject, such as electrocardiograph ("ECG") signals from electrodes, or respiratory signals from a respiratory monitoring device such as a bellows. The physiological signals are typically used by the pulse sequence server 20 to synchronize, or "gate," the performance of the scan with the subject's heart beat or respiration.

In the exemplary embodiment, the pulse sequence server 20 also connects to a scan room interface circuit 42 that receives signals from sensors associated with the condition of the subject and the magnet system. Through the scan room interface circuit 42, a subject positioning system 44 receives commands to move the subject to desired positions before and/or during the scan.

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example. Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by the data processing server 24 are conveyed back to the workstation 12 where they are stored. In some embodiments, real-time images are stored in a database memory cache (not shown in FIG. 1), from which they may be output to operator display 14 or a display (not shown in FIG. 1) that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26 on the workstation 12. The workstation 12 may be used by an operator to archive the images, produce films, or send the images via a network to other facilities.

Figure 2A:
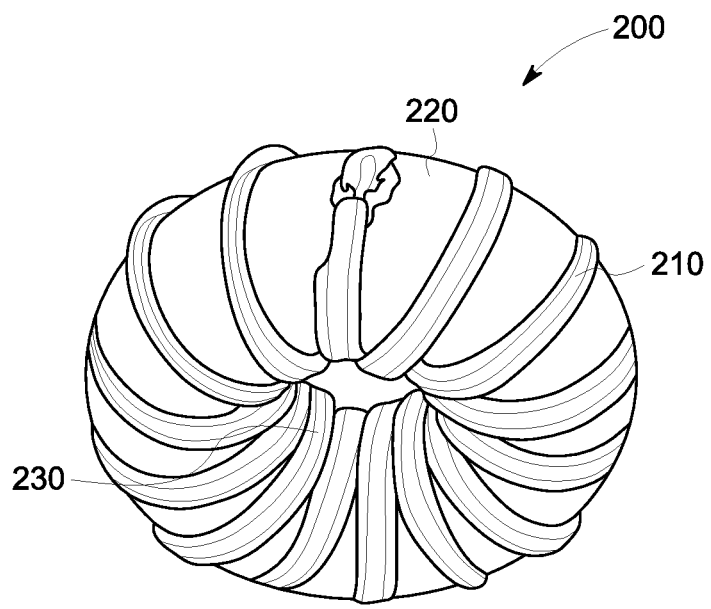
FIGS. 2A-2D illustrate an embodiment of the present disclosure.

Turning now to FIG. 2A, the RF trap or balun 200 comprises spatially distributed inductor which in a preferred embodiment is a conductor system 210 comprising a set of wire loops, which wrap around a doughnut-shaped support structure 220 such that each loop of conductor system 210 is spaced on both the outside and inside of the support structure 220. In a preferred embodiment, the support structure comprises polytetrafluoroethylene (PTFE) and is a solid structure. The hole in the center of support structure 220 may be sized to allow for the RF trap to slidably fit onto a shielded RF cable, such as, for example, a coaxial cable used in MRI systems. Using PTFE, for example, may allow the support structure 220 to be semi-rigid and partially deform providing a frictional fit between the wire loops of conductor system 210 and the coaxial cable.

Figure 2B:
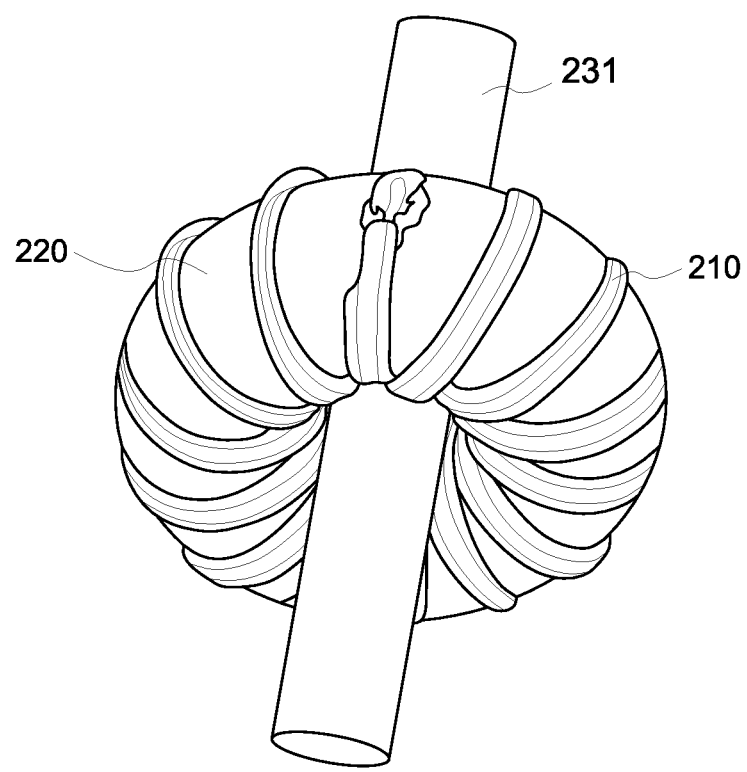

As further illustrated in FIG. 2B, the shield conductor of shielded cable 231 may be coupled in a capacitive manner to the conductive system 210 (shown without support structure 220). A support structure for use with the present disclosure may comprise any known insulator material which may provide support for conductive system 210 and may take the form of a solid or an inflatable structure, such as a structure inclusive of a bladder, for example. A support structure may also be included in or incorporated on the wires used in conductor system 210 such that the stiffness of the wire is sufficient to hold the shape of any loops during handling, installation, and use of RF trap 200. Although a uniformly rounded torus-shaped support structure is illustrated in FIG. 2A, the support structure may take any shape and may, for example, be oblong or diamond-shaped at its cross-section.

Figure 2C:
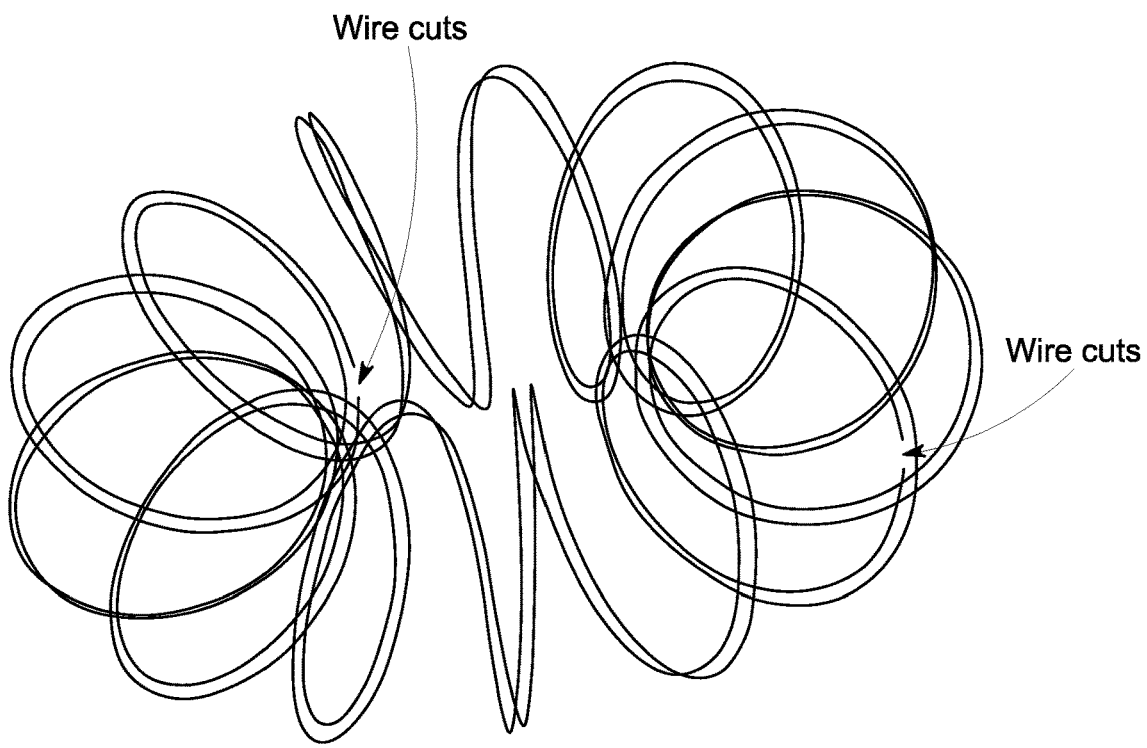
Figure 2D:
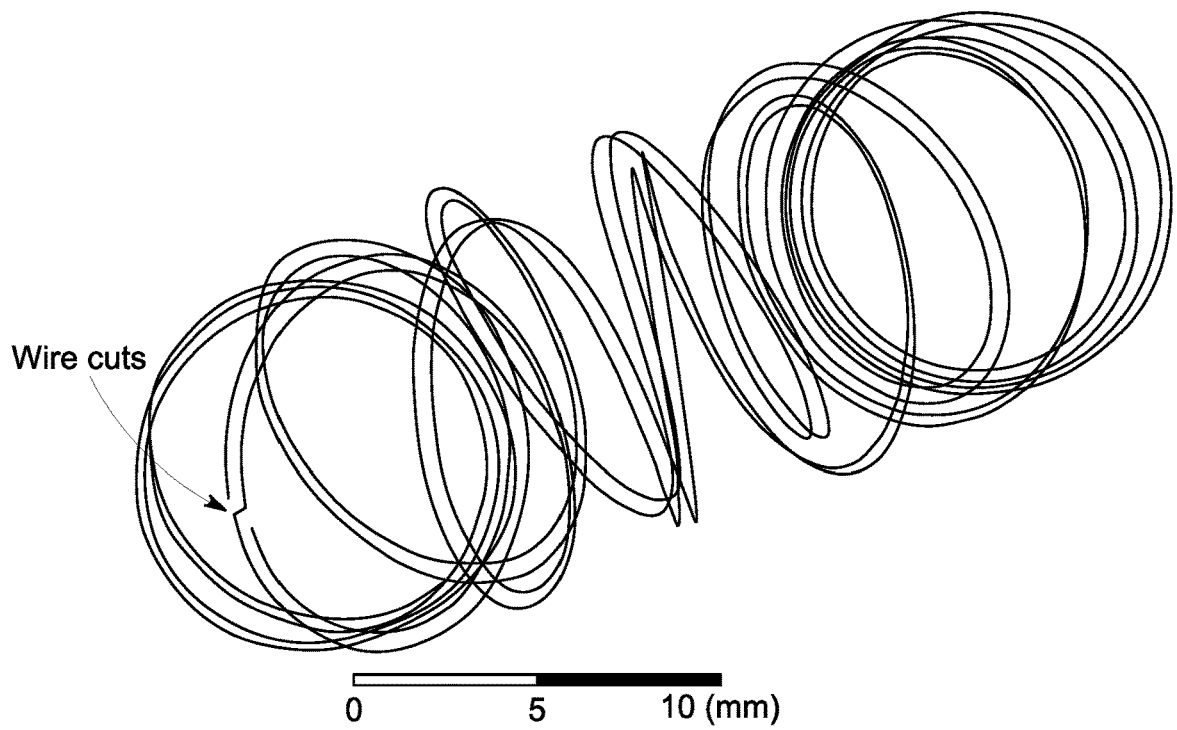
Figure 3:
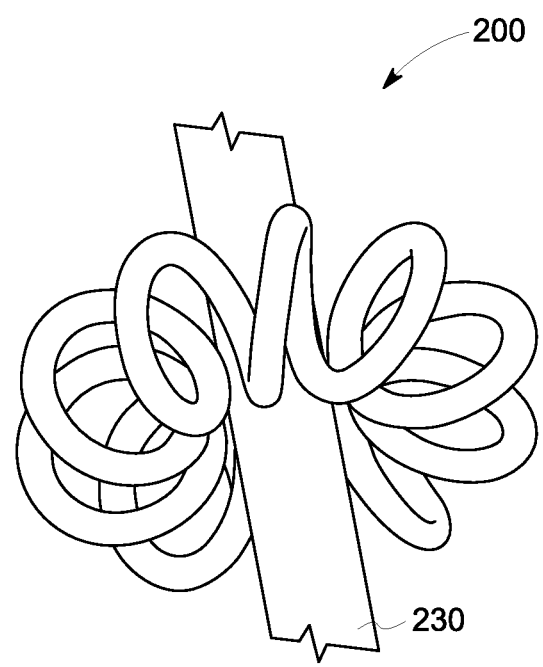
FIG. 3 illustrates an embodiment of the present disclosure.

In a preferred embodiment of the present disclosure, at least one of the two parallel wires in conductor system 210 is noncontiguous, having its terminus end proximate to its lead. In an embodiment of the present disclosure, as illustrated in FIG. 2C, each of the parallel wires of conductor system 210 may be noncontiguous, each having its terminus end proximate to its lead. In such as embodiment, the present disclosure may be tuned to about 128 MHz. Similarly, as illustrated in FIG. 2D, the parallel wires may comprise of a single wire which may be crimped, twisted, or otherwise manipulated to provide for two parallel wires over a majority of the conductive system. In such as embodiment, the present disclosure may be tuned to about 64 MHz.

The number of loops of wire in conductor system 210 may be between, for example, eight (8) and twenty (20). In general, more turns are desirable. The number of turns may be limited by the cross-section of the twinax and internal diameter of the toroid, for example. The number of loops may be dictated by the overall size of the wire used, the size of the shielded cable, and/or the size and shape of the support structure. In a preferred embodiment, the wire used in the loops may lay flat against the support structure or otherwise be perpendicular to the shielded cable, the wires lying side to side along the inner ring 230 of the support structure (as shown in FIG. 2A). In an embodiment of the present disclosure, the loops of wire may be abutted against each other and may, for example, be spaced up to at least 0.5 mm apart from each other along the inner ring of the support structure.

In an embodiment of the present disclosure, the wire may be twisted or turned in a least one location and may include, for example, at least one twist or turn per loop. Changes in the number of twists, turns, and spacing between loops of wire may allow for different tuning of the RF trap. Similarly, the shape and material type of the support structure, as discussed above, may also play a role in the tuning and capacitance of the RF trap. The RF trap of the present disclosure is preferably a tunable capacitor, by which the RF trap may be tuned to match a range of frequencies.

In an embodiment of the present disclosure, the conductor system of the RF trap may comprise a twinax wire (two parallel wires within a dielectric jacket) wrapped around an ellipsoidal toroid-shaped support structure comprising a low dielectric loss material, such as, for example like PTFE. The wire shape may be defined by the following equations for the shielded cable:

$$x_c(t) = \cos(t)(r_0 + a\cos(nt))$$

$$y_c(t) = \sin(t)(r_0 + a\cos(nt))$$

$$z_c(t) = b\sin(nt)$$

Wherein n represents the number of turns of the twinax around the support structure and $r_0$, $a$, $b$ represent the geometry of the support structure.

To account for the direction of any twist of the conductor system, the direction parameter $\sigma = \pm 1$ may be utilized. Thus, the equations for the first wire may be:

$$x_{1\sigma}(t) = r_0 \cos(\sigma t) + a \cos(\sigma t)\cos(nt) + r_1 \sin(\sigma t)$$

$$y_{1\sigma}(t) = r_0 \sin(\sigma t) + a \sin(\sigma t)\cos(nt) - r_1 \cos(\sigma t)$$

$$z_{1\sigma}(t) = b \sin(nt)$$

And the equations for the second wire may be:

$$x_{2\sigma}(t) = r_0 \cos(\sigma t) + a \cos(\sigma t)\cos(nt) - r_1 \sin(\sigma t)$$

$$y_{2\sigma}(t) = r_0 \sin(\sigma t) + a \sin(\sigma t)\cos(nt) + r_1 \cos(\sigma t)$$

$$z_{2\sigma}(t) = b \sin(nt)$$

wherein n represents the number of turns in the wire and $r_0$, $a$, $b$ represent the geometry of the support structure, and wherein:

TABLE 1

| $r_0$, [mm] | a, [mm] | b, [mm] | $r_1$, [mm] | n | $r_{wire}$, [mm] |
|---|---|---|---|---|---|
| 6.235 | 2.1601 | 7.25794 | 0.448311 | 8 | 0.18669 |

In an embodiment of the present disclosure, the support structure may take a form congruous to a supuperellipse or Lamé curve. The equations above may be rewritten utilizing the function $\psi_s(x) = \text{sgn}(x)|x|^{2/s}$, where s is the order of the superellipse (s=2 corresponding to regular ellipse) and the function:

$$\text{sgn}(x) = \begin{cases} -1, & x < 0 \\ 0, & x = 0 \\ 1, & x > 0 \end{cases}$$

Thus the central line is defined as:

$$x_c(t) = \cos(t)(r_0 + a\psi_s(\cos(nt)))$$

$$y_c(t) = \sin(t)(r_0 + a\psi_s\cos(nt)))$$

$$z_c(t) = b\psi_s(\sin(nt))$$

And the wires are defined as:

$$x_{(1,2)\sigma}(t) = r_0 \cos(\sigma t) + a \cos(\sigma t)\psi_s(\cos(nt)) \pm r_1 \sin(\sigma t)$$

$$y_{(1,2)\sigma}(t) = r_0 \sin(\sigma t) + a \sin(\sigma t)\psi_s(\cos(nt)) \pm r_1 \cos(\sigma t).$$

$$z_{(1,2)\sigma}(t) = b\psi_s(\sin(nt))$$

Figure 8:
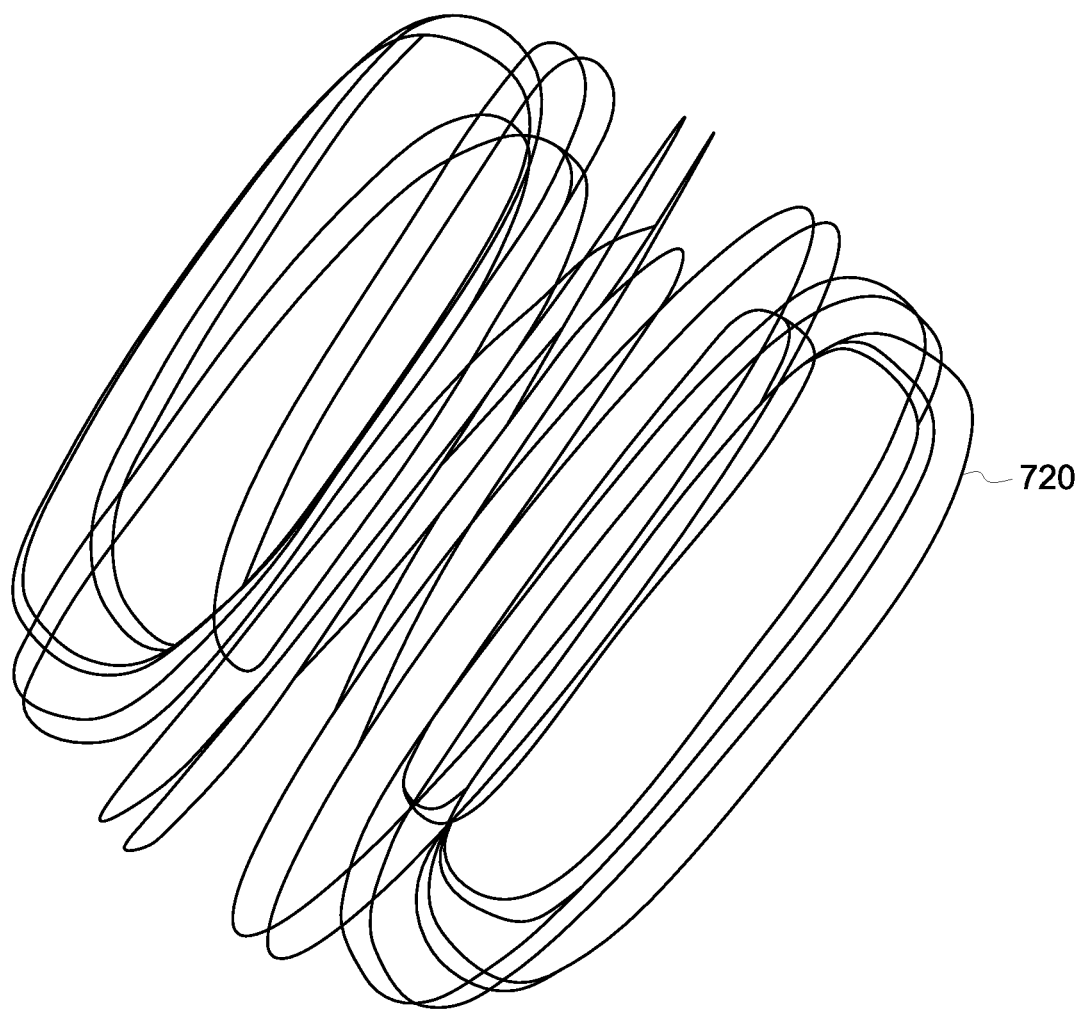
FIG. 8 illustrates and embodiment of the present disclosure.

In an embodiment of the present disclosure, as illustrated in FIG. 8, a superelliptical toroid of order s=3 may be used with an RF Trap and may include a pair of wires 720.

Figure 4:
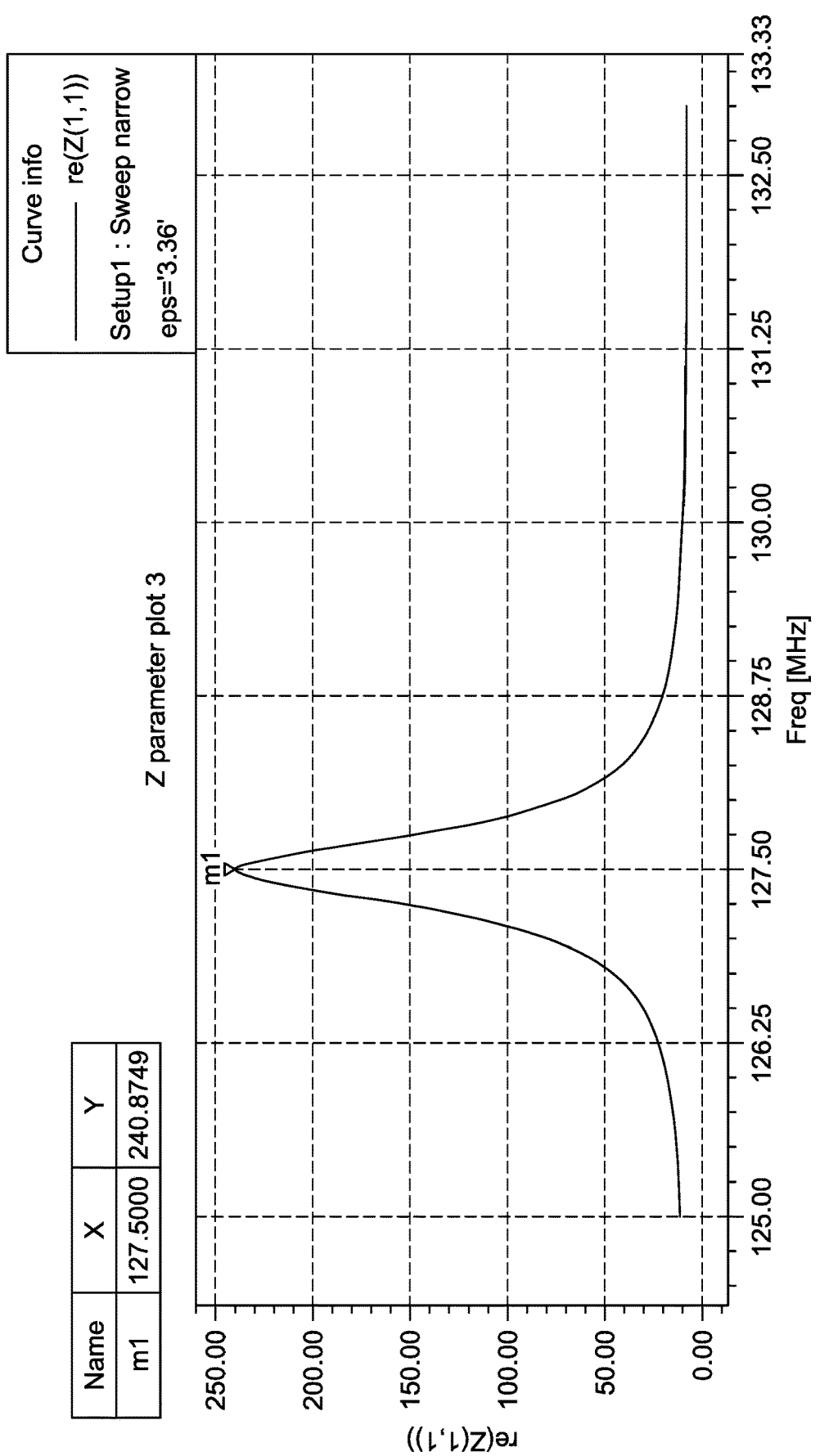
FIG. 4 is a graphical illustration of the tuning of an embodiment of an RF trap.
Figure 5:
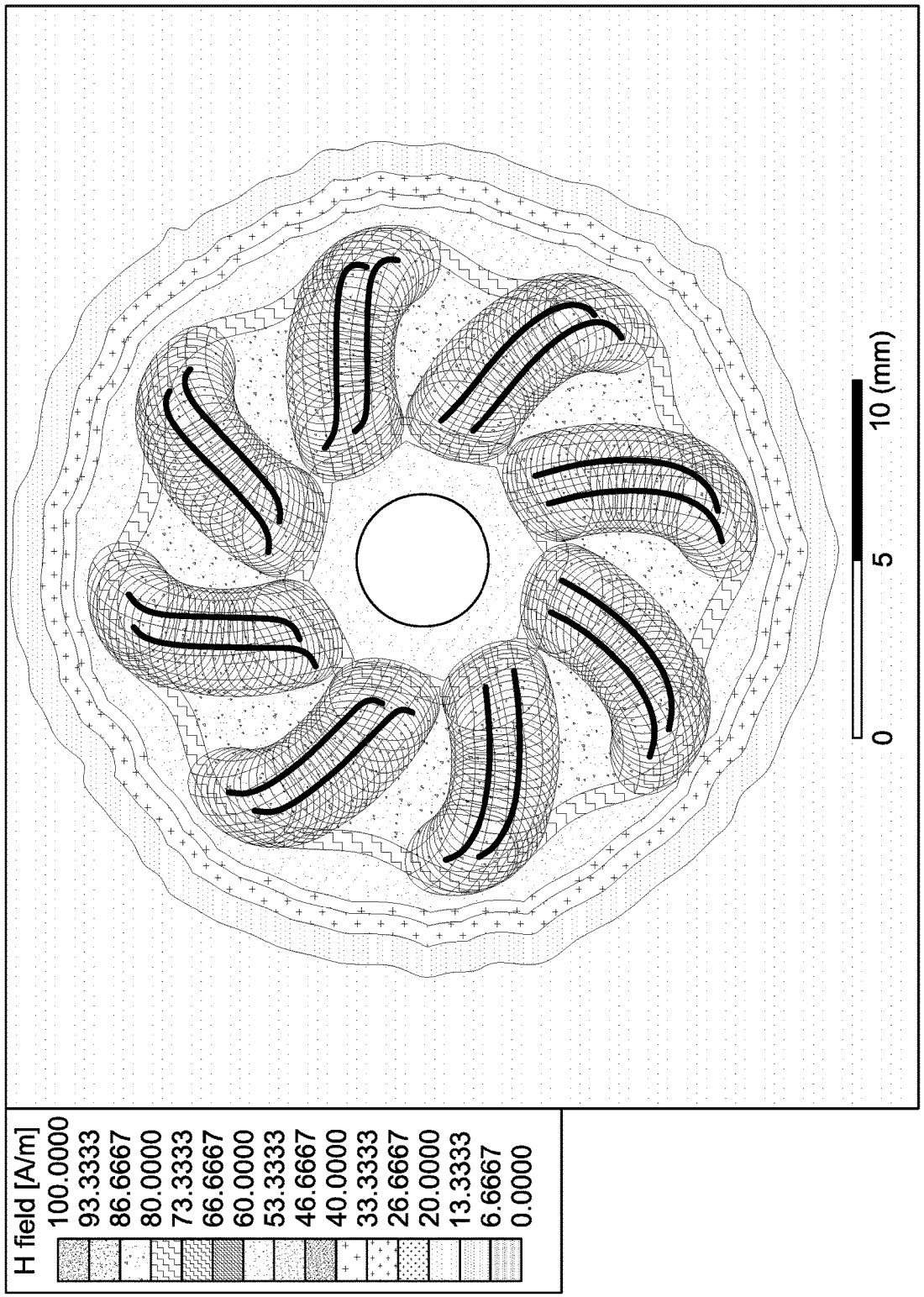
FIG. 5 is a transverse cross-section of an RF trap shown with a magnetic field.

An RF tap with parameters such as those in Table 1 may be tuned to about 127.5 MHz, as illustrated in FIG. 4 and may demonstrate a magnetic field generated by current from a shielded cable as illustrated in FIG. 5. In an embodiment of the present disclosure, an RF trap may generate a magnetic field having at least 100 A/m within the bounds of the trap. Mutual electromagnetic coupling between the resonant circuit of the present disclosure and the shielded cable generates a high impedance at the resonant frequency on the shielded cable which acts to block the RF currents on the cable shield. Although the shielded cable has been described herein as a coaxial cable, other RF cable types, such as triaxial cables, for example, may also be trapped by the RF trap.

Figure 6:
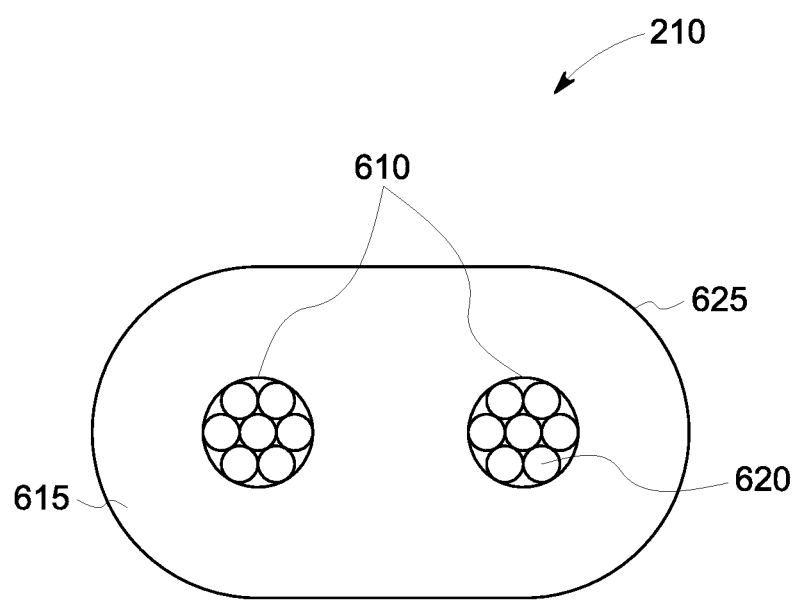
FIG. 6 is a transverse cross-section of the conductive system of an FR trap of the present disclosure.

As illustrated in FIG. 6, the conductor system 210 of the present disclosure may have two wires 610 encased within a dielectric jacket 615, which may comprise, for example, PTFE. Each ones of the wires 610 may further comprise a discreet set of wires 620. In an embodiment of the present disclosure, the conductor system 210 may preferably be about 1 mm in height and about 1.5 mm to about 2 mm in width and each of wires 610 may be about 0.36 mm in diameter. Each of wires 610 may be vertically centered within dielectric jacket 615 and may be horizontally centered in each half of the dielectric jacket 615 of the conductor system 210.

In an embodiment of the present disclosure, each wire 610 may comprise a subset of seven wires 620. Each of the wires 620 may be composed of a conductive metal, such as, for example, copper, and may preferably be in parallel with each other. In embodiments of the present disclosure, one of more of the wires 620 may be twisted around one another to create at least one twisted pair. The outer shell 625 of conductor system 210 may comprise the same material as dielectric jacket 615 or may comprise support structure material. As would be appreciated by those skilled in the art, the outer shall 625 may be coated with a relatively stiff, but pliable, material, such as a thermoplastic, for example, to provide self-supporting rigidity to the conductor system 210 when in, for example, a loop-shaped form.

Figure 7:
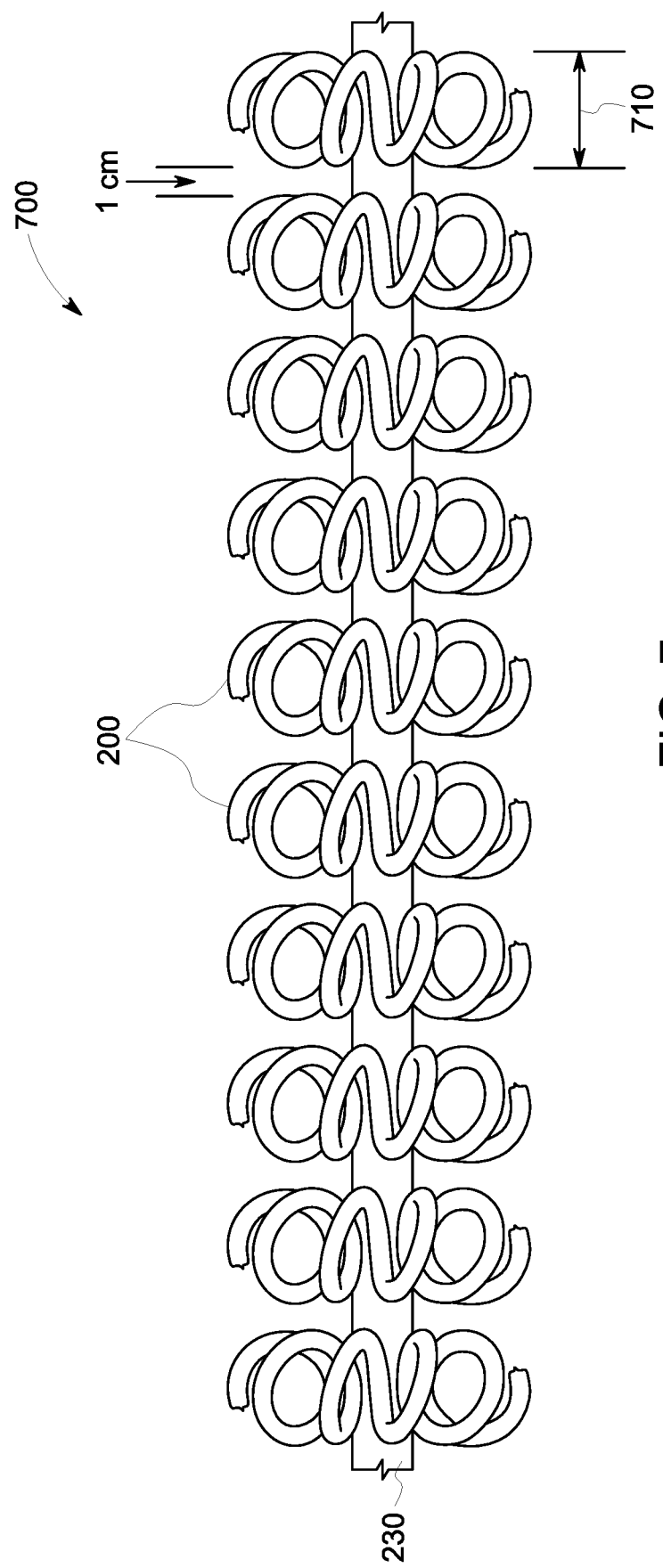
FIG. 7 illustrates a plurality of continuous and/or contiguous RF traps along a linear shielded cable.

Two or more RF traps may be used together in series to increase the impedance along a shielded cable. For example, where each RF trap is tuned to approximately the same frequency, a single RF trap may increase impedance by about 84 ohms, two RF traps in series my increase impedance by about 167 ohms, while a plurality of about seven RF traps may increase impedance by about 550 ohms. As illustrated in FIG. 7, a plurality of RF traps 200 may reside in series on a portion of shielded cable 231 and may, preferably, be about 1 cm apart from each other. Alternatively, each RF trap 200 may be spaced apart by a distance equal to the thickness 710 of the RF trap. In an embodiment of the present disclosure, a plurality of ten RF traps having a thickness 710 of about 1 cm and being spaced about 1 cm apart from each other, may provide an increase in impedance of about 780 ohms. Although spacing is preferred, the impedance properties of the series of RF traps does not substantively change if any ones of the plurality of RF traps may be in contact with each other. Indeed, within the confines of an MRI machine, it may not be practical or possible to maintain spacing between the RF traps.

As illustrated in FIG. 7. RF traps may be placed on a linear portion of a shielded cable. In an embodiment of the present disclosure, the shielded cable may be curved. Curvature the shielded cable allows for greater impedance by both single RF traps and multiple RF traps in series. For example, a single RF trap on a curved shielded cable may increase impedance by about 87 ohms, wherein two RF traps placed in series along the same curvature of the cable my increase impedance by about 193 ohms (again assuming each RF trap is tuned to approximately the same frequency). Similarly, as compared to an increase of about 780 ohms, a series of ten RF traps along a curvature may increase impedance by about 880 ohms.

In general, impedance increases almost proportionally as REF traps having the same characteristics are added in series to each other. In an embodiment of the present disclosure, the plurality of RF traps may not be tuned to the same frequency. For example, RF traps tuned to either 64 MHz and 128 MHz may be alternatively placed in series to create various outcomes in impedance. As would be appreciated by those skilled in the art, 64 MHz is the resonant frequency for 1.5 T MR, system and 128 MHz is for 3 T MRI system. By using a subset of each type of RF trap, for example, an cable having such an array of RF traps may be compatible with both system use cases.

As used herein, an element or step recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising," "including" or "having" an element or a plurality of elements having a particular property may include additional such elements not having that property. The terms "including" and "in which" are used as the plain-language equivalents of the respective terms "comprising" and "wherein." Moreover, the terms "first" "second," and "third" etc. are used merely as labels, and are not intended to impose numerical requirements or a particular positional order on their objects.

This written description uses examples to disclose the disclosure, including the best mode, and also to enable a person of ordinary skill in the relevant art to practice the disclosure, including making and using any devices or systems and performing any incorporated methods. The patentable scope of the disclosure is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. An RF (Radio Frequency) trap for blocking stray signals on a shielded RF cable having a peripheral shield conductor and at least one inner conductor for carrying RF signals, the RF trap, comprising:
    a conductive system inductively coupled to the shield conductor of the shielded RF cable comprising two parallel wires wherein at least one of the wires is noncontiguous;
    capacitive coupling between the conductive system and the shield conductor, the capacitive coupling being sized and the conductive system being shaped such that the capacitive and inductive couplings define an LC circuit with a resonance frequency at a frequency of RF signals carried on the inner conductor; and
    a support structure for substantially maintaining the shape of the conductive system, the shape of the conductive system comprising a plurality of loops wrapped around the support structure and sized to surround the shielded RF cable.

2. The RF trap according to claim 1, wherein the support structure is torus-shaped.

3. The RF trap according to claim 1, wherein the support structure comprises material containing polytetrafluoroethylene (PTFE).

4. The RF trap according to claim 1, wherein the conductive system comprises the support structure.

5. The RF trap according to claim 1, wherein each of the wires is noncontiguous.

6. The RF trap according to claim 1, wherein the impedance of the LC circuit reaches a maximum at about 128 MHz.

7. The RF trap according to claim 1, wherein the impedance of the LC circuit reaches a maximum at about 64 MHz.

8. The RF trap according to claim 1, wherein the conductive system comprises at least 20 loops.

9. The RF trap according to claim 1, wherein the conductive system comprises more than two but less than fourteen loops.

10. The RF trap according to claim 1, wherein the two parallel wires are twisted.

11. The RF trap according to claim 1, wherein the two parallel wires have a plurality of twists.

12. A magnetic resonance imaging (MRI) system, comprising:
    a magnet system configured to generate a polarizing magnetic field about at least a portion of a subject arranged in the MRI system;
    a magnetic gradient system including a plurality of magnetic gradient coils configured to apply at least one magnetic gradient field to the polarizing magnetic field;
    a radio frequency (RF) system configured to apply an RF field to the subject and to receive magnetic resonance signals from the subject using a coil array;
    one or more RF traps each including a conductive system inductively coupled to a shield conductor of a shielded RF cable, each one of the conductive system comprising two parallel wires wherein at least one of the wires is noncontiguous;
    capacitive coupling between the conductive system and the shield conductor, the capacitive coupling being sized and the conductive system being looped shaped such that the capacitive and inductive couplings define an LC circuit with a resonance frequency at a frequency of RF signals carried on an inner conductor of the shielded RF cable; and
    a support structure for substantially maintaining a looped shape conductive system and sized to surround the shielded RF cable;

wherein the one or more RF traps are noncontiguously proximate to each other along the shielded RF cable.

13. The system of claim 12, wherein the impedance of the LC circuit is about 780 ohms.

14. The system of claim 12, wherein the impedance of the LC circuit is about 395 ohms.

15. The system of claim 12, wherein the support structure is in the shape of a torus, ellipse, or superellipse of orders greater than 2.

16. The system of claim 12, wherein the support structure comprises material containing polytetrafluoroethylene (PTFE).

17. The system of claim 12, wherein each of the wires of at least one of the one or more RF traps is noncontiguous.

18. The system of claim 12, wherein the LC circuit of the one or more RF traps is tuned to about 64 MHz and wherein the LC circuit of at least one of the one or more RF traps is tuned to about 128 MHz.

19. The system of claim 12, wherein the support structure of the one or more RF traps is less than about 3 cm in diameter.

20. The system of claim 12, wherein the conductive system of the one or more RF traps comprises more than two but less than fourteen loops.

* * * * *